United States Patent
Kim (10) Patent No.: US 10,763,758 B1
(45) Date of Patent: Sep. 1, 2020

(54) POWER CONVERTING APPARATUS

(71) Applicants: HYUNDAI MOTOR COMPANY, Seoul (KR); KIA MOTORS CORPORATION, Seoul (KR)

(72) Inventor: Yun Ho Kim, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/541,382

(22) Filed: Aug. 15, 2019

(30) Foreign Application Priority Data

Feb. 18, 2019 (KR) .................. 10-2019-0018419

(51) Int. Cl.
*H05K 7/20* (2006.01)
*H02M 7/00* (2006.01)
*B60R 16/033* (2006.01)

(52) U.S. Cl.
CPC .......... *H02M 7/003* (2013.01); *B60R 16/033* (2013.01); *H05K 7/20872* (2013.01); *H05K 7/20927* (2013.01)

(58) Field of Classification Search
CPC ....... H01L 2924/00; H01L 2924/13091; H01L 2924/13055; H01L 23/473; H01L 25/072; H01L 2924/1305; H01L 2924/19041; H01L 21/52; H02M 7/003; H02M 7/537; H02M 7/5387; H02M 1/44; H02M 7/44; H02M 3/33569; H02M 7/00; H05K 7/20927; H05K 7/1432; H05K 7/209; H05K 5/0026; H05K 7/2089; H05K 1/0203; H05K 1/144; H05K 7/20945; H02P 27/06; H02P 2101/45; H02K 11/33; H02K 11/022
USPC ..... 361/699, 306.1, 689, 704, 752; 165/80.4
See application file for complete search history.

(56) References Cited

U.S. PATENT DOCUMENTS 7,508,668 B2    3/2009  Harada et al.
2018/0013355 A1*  1/2018  Tokuyama ............. H01L 25/07

FOREIGN PATENT DOCUMENTS

KR    10-2013-0065390 A    6/2013

* cited by examiner

*Primary Examiner* — Mandeep S Buttar
(74) *Attorney, Agent, or Firm* — Morgan, Lewis & Bockius LLP (57) ABSTRACT

A power converting apparatus according to the present disclosure includes: a capacitor being supplied with a DC from a battery of a vehicle; at least one or more power converting modules including a power terminal through which a current is input and output and a signal terminal through which signals are input and output, and disposed perpendicular to the capacitor with the power terminal facing the bottom of the capacitor and the signal terminal facing the top of the capacitor; a control unit disposed over the capacitor and controlling the power converting module; and a housing assembled with the capacitor, the power converting module, and the control unit.

12 Claims, 6 Drawing Sheets

POWER CONVERTING APPARATUS

CROSS REFERENCE TO RELATED APPLICATION

The present application claims priority to Korean Patent Application No. 10-2019-0018419, filed Feb. 18, 2019 in the Korean Intellectual Property Office, the entire contents of which is incorporated herein for all purposes by this reference.

TECHNICAL FIELD

The present disclosure relates to a power converting apparatus, and more particularly, to a power converting apparatus that can block electromagnetic waves, which are generated by a power converting module, from being transmitted to a control unit with a specific shield plate.

BACKGROUND

A power converting apparatus of an eco-friendly vehicle receives a DC from a high-voltage battery, converts the DC into an AC, supplies the AC to a motor, and controls torque and revolutions per minute of the motor by adjusting intensity and phase of the AC.

In general, the inside of a power converting apparatus can be divided into a power unit that converts a DC into an AC and a control unit that controls the intensity and phase of a current. The power unit is composed of a bus bar through which a current flows, a switch elements converting a current, and a power module and the control unit is composed of a gate board, a control board, and wires transmitting/receiving signals to/from sensors.

The power unit generates electromagnetic waves when a current flows or switching is performed by a plurality of switching elements constituting the power module, and the electromagnetic waves influence the control unit, whereby they may cause a malfunction or may stop the control unit. The control board is a part that is most vulnerable to electromagnetic waves of the parts of the control unit, and power converting apparatuses of the related art have a metallic shield plate to shield the control board from electromagnetic waves.

However, the shield plate has a limit that it only blocks paths to prevent electromagnetic waves from influencing the control board and cannot completely separate the control board from electromagnetic waves. Further, when the paths of electromagnetic waves are not completely blocked due to an improper design of a shield plate, there is a danger in that the control board may generate a malfunction. Further, there is another problem that the manufacturing cost, and weight and volume of a power converting apparatus, are increased due to a shield plate.

SUMMARY

The present disclosure has been made in an effort to solve the problems and an aspect of the present disclosure is to provide a power converting apparatus that can block electromagnetic waves, which are generated by a power converting module, from being transmitted to a control unit without a specific shield plate.

In view of the above aspect, a power converting apparatus according to the present disclosure includes: a capacitor being supplied with a DC from a battery of a vehicle; at least one or more power converting modules including a power terminal through which a current is input and output and a signal terminal through which signals are input and output, and disposed perpendicular to the capacitor with the power terminal facing a bottom of the capacitor and the signal terminal facing a top of the capacitor; a control unit disposed over the capacitor and controlling the power converting module; and a housing assembled with the capacitor, the power converting module, and the control unit.

The power converting apparatus may further include a power supply terminal for supplying a DC to the power converting module and a bus bar transmitting a current output from the power converting module to a driving unit disposed on the bottom of the capacitor.

The power terminal of the power converting module may include an input terminal supplied with a DC from the power supply terminal of the capacitor and an output terminal outputting an AC converted from the DC and connected with the bus bar.

The power converting apparatus may further include an epoxy disposed between the bottom of the capacitor and the bus bar.

The control unit may be connected with the signal terminal of the power converting module and may control the power converting module by applying the signal to the power converting module through the signal terminal.

A horizontal area of the capacitor may be equal to or larger than a horizontal area of the control unit.

The power converting apparatus may further include: at least one or more coolers disposed on both sides of the power converting module and cooling the power converting module; and a cooler cover covering the coolers.

The cooler may include a plurality of cooling tubes through which cooling water flows, and an inlet and an outlet through which cooling water flows inside and outside, and the power converting module may be disposed between the plurality of cooling tubes.

The cooler may be disposed in contact with a side of the capacitor to cool the capacitor.

The power converting apparatus may further include a housing cover covering an open top of the housing.

The control unit may include a control board and a gate board, and the control board and the gate board may be connected through a wire.

The gate board may be connected with the signal terminal of the power converting module, and the control board may be disposed over and in parallel with the gate board.

According to the present disclosure, as described above, the power converting module is disposed perpendicular to the capacitor with the power terminal facing the bottom of the capacitor and the signal terminal facing the top of the capacitor, the control unit is disposed over the capacitor, and the power terminal of the power converting module that generates electromagnetic waves and the control unit are spaced. Therefore, it is possible to block electromagnetic waves generated at the power terminal from being transmitted to the control unit.

Further, the capacitor, the cooler, and a cooler cover are disposed between the control unit and the power terminal of the power converting module. Accordingly, the capacitor, the cooler, and the cooler cover function as a shield, so it possible to block electromagnetic waves generated at the power terminal from being transmitted to the control unit without installing a physical shield plate.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Hereinafter, a power converting apparatus according to various embodiment is described in detail with reference to the accompanying drawings.

Figure 1:
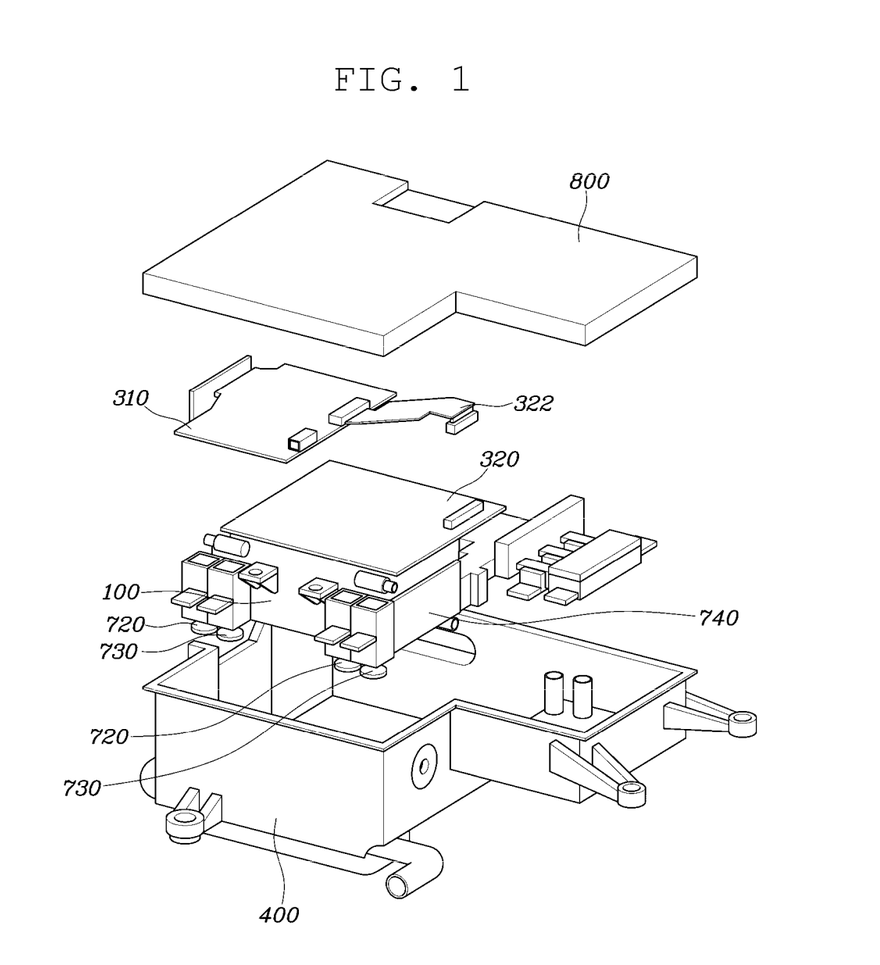
FIG. 1 is an exploded perspective view of a power converting apparatus according to an embodiment of the present disclosure.
Figure 2:
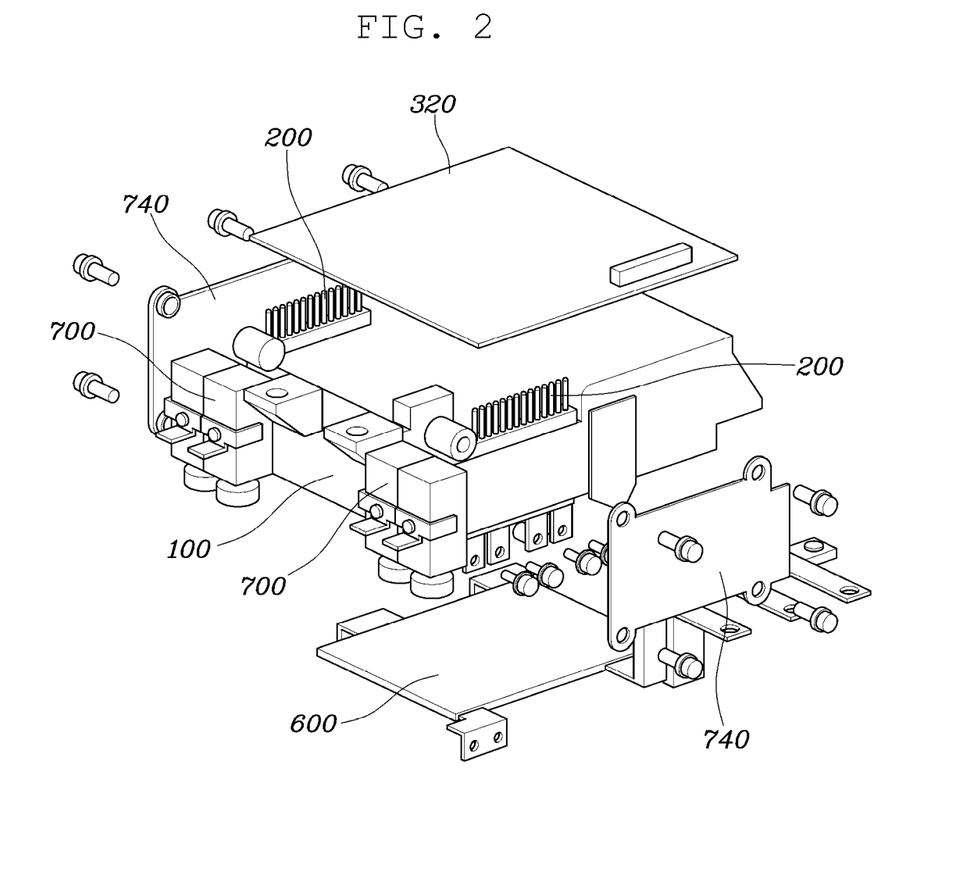
FIG. 2 is an exploded perspective view showing in detail the power converting apparatus according to an embodiment of the present disclosure.
Figure 3:
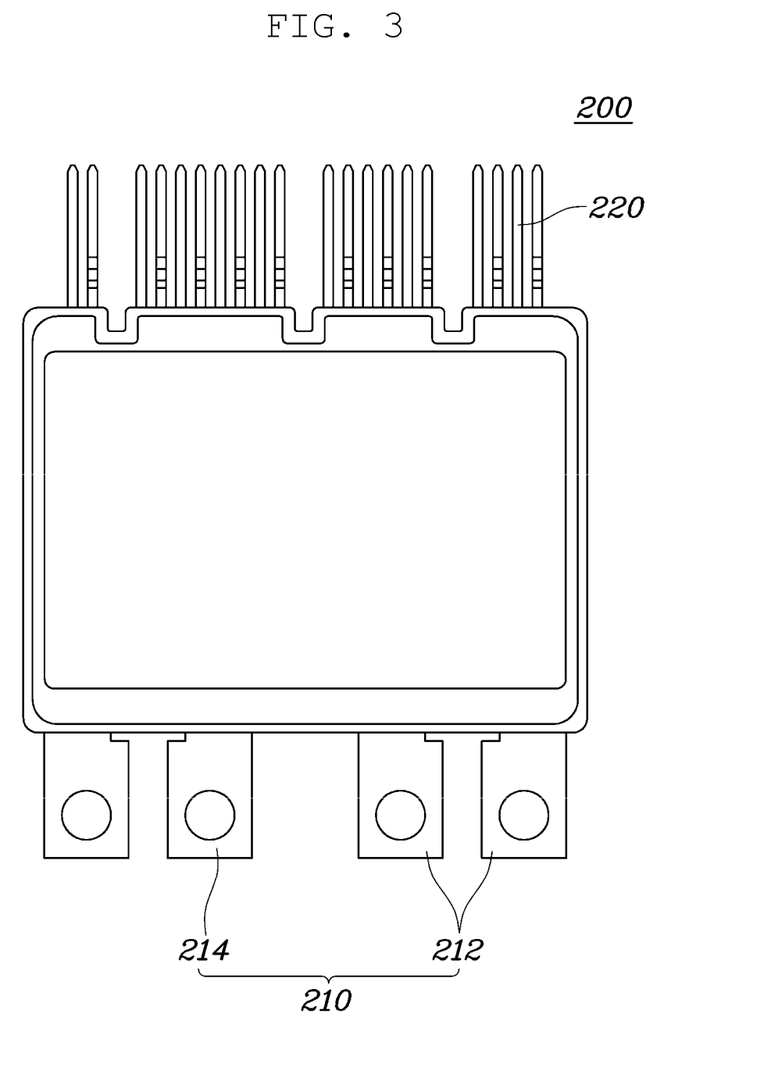
FIG. 3 is a view showing the structure of a power converting module in the power converting apparatus according to an embodiment of the present disclosure.
Figure 4:
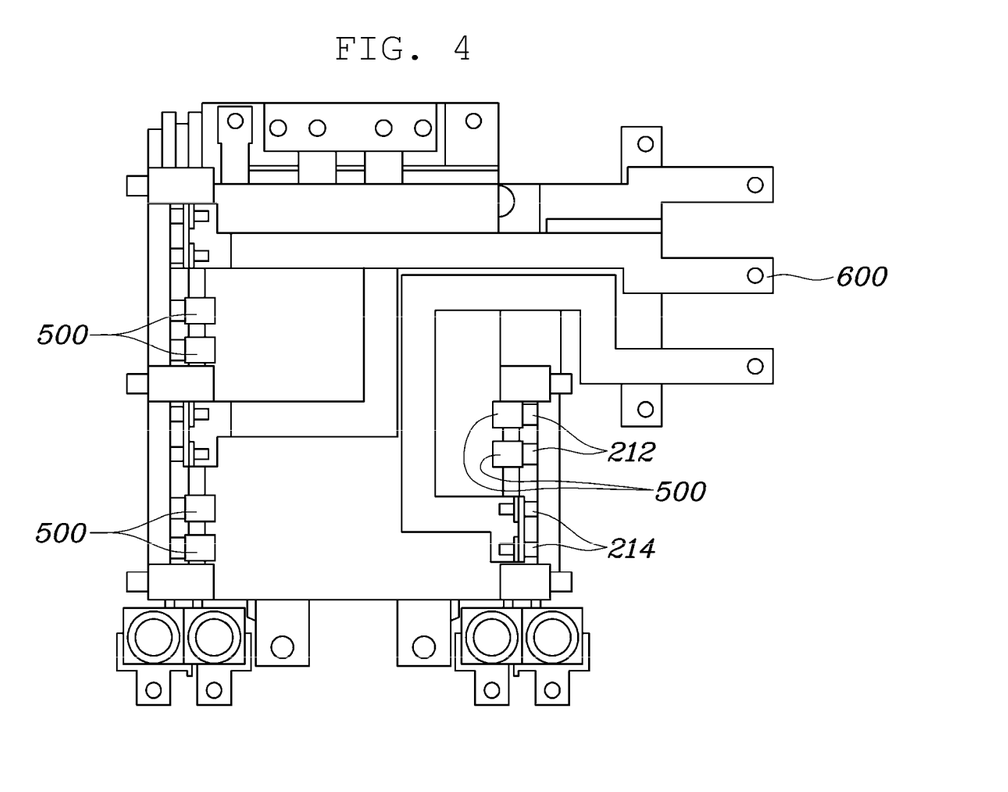
FIG. 4 is a view showing a current supply terminal and a bus bar on the bottom of a capacitor in the power converting apparatus according to an embodiment of the present disclosure.
Figure 5:
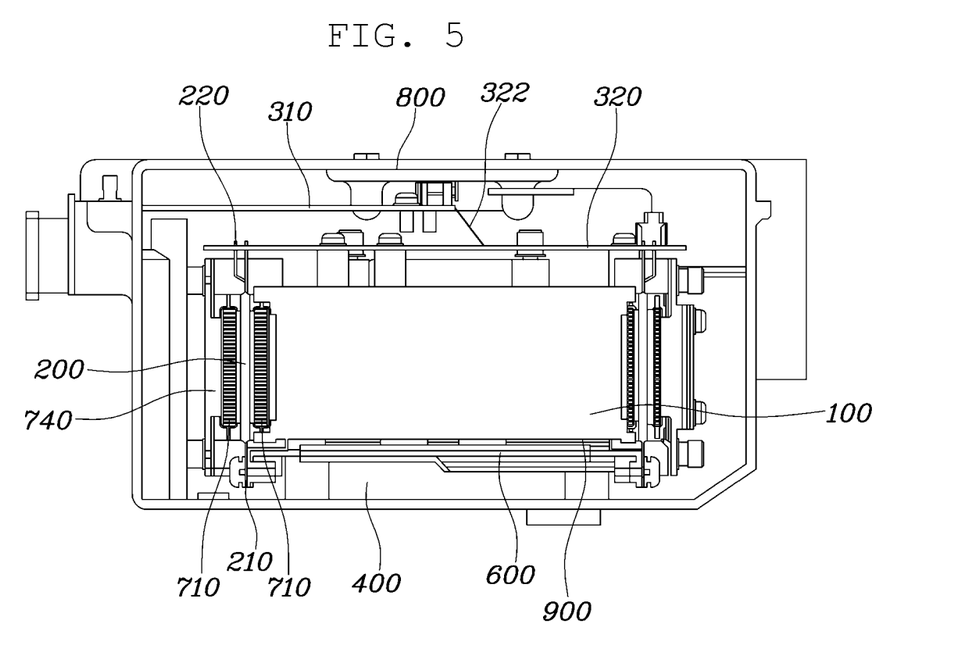
FIG. 5 is a cross-sectional view illustrating a structure in which electromagnetic waves generated by a power terminal and a bus bar of a power converting module are blocked without being transmitted to a control unit in the power converting apparatus according to an embodiment of the present disclosure.
Figure 6:
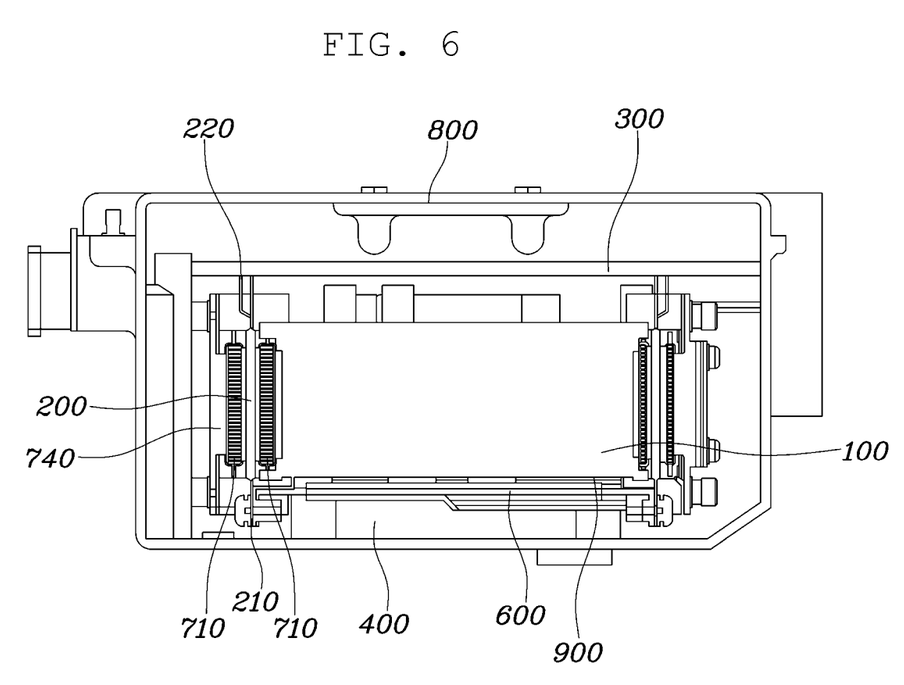
FIG. 6 is a view showing the structure of a power converting apparatus including a control unit in which a control board and a gate board are integrated in accordance with another embodiment of the present disclosure.

FIG. 1 is an exploded perspective view of a power converting apparatus according to an embodiment of the present disclosure, FIG. 2 is an exploded perspective view showing in detail the power converting apparatus according to an embodiment of the present disclosure, FIG. 3 is a view showing the structure of a power converting module, FIG. 4 is a view showing a current supply terminal and a bus bar on the bottom of a capacitor, FIG. 5 is a cross-sectional view illustrating a structure in which electromagnetic waves generated by a power terminal and a bus bar of a power converting module are blocked without being transmitted to a control unit in the power converting apparatus according to an embodiment of the present disclosure, and FIG. 6 is a view showing the structure of a power converting apparatus including a control unit in which a control board and a gate board are integrated in accordance with another embodiment of the present disclosure.

Referring to FIGS. 1 to 5, a power converting apparatus according to an embodiment of the present disclosure may include a capacitor 100, a power converting module 200, a control unit 300, and a housing 400.

The capacitor 100 can be supplied with a DC from a battery (not shown) of a vehicle and can supply the DC to the power converting module 200. In detail, referring to FIGS. 2 to 4, a current supply terminal 500 for supplying a DC to the power converting module 200 and a bus bar 600 for transmitting a current output from the power converting module 200 to a driving unit may be disposed on the bottom of the capacitor 100. The driving unit may be a motor, depending on embodiments. Though not shown in detail in the drawings, an output terminal of the power converting apparatus may be connected to the driving unit, and the bus bar 600 may be connected with the output terminal. Accordingly, a DC can be supplied from the capacitor 100 to the power converting module 200 and an AC converted by the power converting module 200 can be supplied to the motor through the bus bar 600 and the output terminal, so as to drive the motor.

Epoxy 900 may be disposed between the bottom of the capacitor 100 and the bus bar 600.

The power converting module 200 includes a plurality of switching elements and converts a DC supplied from the capacitor 100 into an AC. The power converting apparatus according to the present disclosure may include at least one or more power converting modules 200. Depending on embodiments, the power converting module 200 may include an Insulated Gate Bipolar Transistor (IGBT) or a power converting circuit composed of Insulated Gate Bipolar Transistors (IGBTs). However, this is only an exemplary embodiment and various semiconductor devices may be used as the power converting module of the present disclosure.

In detail, referring to FIG. 3, the power converting module 200 may include a power terminal 210 through which a current is input and output and a signal terminal 220 through which signals are input and output.

The power terminal 210 may include an input terminal 212 electrically connected with the current supply terminal 500 on the bottom of the capacitor 100 and being supplied with a DC from the capacitor 100 and an output terminal 214 outputting an AC converted from a DC through a plurality of switching elements of the power converting module 200. The output terminal 214 may be electrically connected with the bus bar 600.

The signal terminal 220 is connected with the control unit 300 to be described below and a control signal can be received from the control unit 300 through the signal terminal 220.

As shown in FIG. 5, the power converting module 200 may be disposed perpendicular to the capacitor 100 with the power terminal 210 facing the bottom of the capacitor 100 and the signal terminal 220 facing the top of the capacitor 100. The control unit 300 that controls the power converting module 200 may be disposed over the capacitor 100.

In general, electromagnetic waves may be generated at a power terminal that inputs/outputs a current and through which a current flows in the power converting module. The electromagnetic waves generated in this way may cause malfunction of a control unit or may stop the control unit by influencing the control unit. A shield plate (not shown) was disposed between a power terminal of a power converting module and a control unit in the related art to solve this problem, thereby blocking electromagnetic waves generated by the power converting module from being transmitted to the control unit. However, the shield plate has a limit that it only blocks paths to prevent electromagnetic waves from influencing the control unit and cannot completely separate the control unit from electromagnetic fields. Further, when the paths of electromagnetic waves are not completely blocked due to an improper design of a shield plate, the control unit may generate malfunction.

However, according to the present disclosure, as described above, the power module 200 is disposed perpendicular to the capacitor 100 with the power terminal 210 facing the bottom of the capacitor 100 and the signal terminal 220 facing the top of the capacitor 100, the control unit 300 is disposed over the capacitor 100, and the power terminal 210 of the power converting module 200 that generates electromagnetic waves and the control unit 300 are spaced apart from each other. Therefore, it is possible to block electromagnetic waves generated at the power terminal 210 from being transmitted to the control unit 300.

Further, the capacitor 100, and a cooler 700 and a cooler cover 740 that will be described below are disposed between the control unit 300 and the power terminal 210 of the power converting module 200. Accordingly, the capacitor 100, the cooler 700, and the cooler cover 740 function as a shield, so it is possible to block electromagnetic waves generated at the power terminal 210 from being transmitted to the control unit 300 without installing a physical shield plate.

The control unit 300, which may include one or more circuit boards each having a microprocessor, a circuit, electronic devices, and/or a chip disposed thereon, controls the power converting module 200 and may be disposed over the capacitor 300 to be physically spaced apart from the power terminal 210 of the power converting module 200. Depending on embodiments, as shown in FIG. 5, the control unit 300 may include a control board 310 and a gate board 320, and the control board 310 and the gate board 320 may be connected through a wire 322. The control board 310 may be disposed over and in parallel with the gate board 320. The gate board 320, as shown in FIG. 5, may be connected with the signal terminal 220 of the power converting module 200. Depending on embodiments, the gate board 320 may be connected with the signal terminal 220 by soldering or press-fitting.

Further, depending on embodiments, the control unit 300, as shown in FIG. 6, may be configured such that the control board 310 and the gate board 320 are integrated. In detail, the control unit 300, as shown in FIG. 6, may be connected with the signal terminal 220 of the power converting module 200 and can control the intensity etc. of the current that is converted by the power converting module 200 by applying a control signal to the power converting module 200 through the signal terminal 220.

Depending on embodiments, the power converting apparatus may include sensors such as a current sensor and a temperature sensor. The control unit 300 can be connected with the sensors through wires etc., can receive sensed information from the sensors, and can control the power converting module 200 on the basis of the sensed information. The control unit 300 can also be connected with a signal terminal of a vehicle, thereby controlling the power converting apparatus on the basis of a control signal received from the vehicle.

It is preferable that the horizontal area of the capacitor 100 is equal to or larger than the horizontal area of the control unit 300. The power terminal 210 of the power converting module 200 that generates electromagnetic waves and the control unit 300 are physically separated by the capacitor 100 in the present disclosure. The horizontal area of the capacitor 100 is equal to or larger than the horizontal area of the control unit 300, and thus, it is possible to more efficiently block electromagnetic waves, which are generated at the power terminal 210 disposed at the lower end of the capacitor 100 of the power converting module 200, from being transmitted to the control unit 300.

The power converting apparatus according to the present disclosure may further include at least one or more coolers 700 disposed on both sides of the power converting module 200 to cool the power converting module 200, and a cooler cover 740 covering the coolers 700. In detail, the cooler 700 may include a plurality of cooling tubes 710 through which cooling water flows, and an inlet 720 and an outlet 730 through which cooling water flows inside and outside. The power converting module 200 may be disposed between the cooling tubes 710. As described, in the power converting apparatus according to the present disclosure, it is possible to improve cooling performance by cooling the power converting module 200 on both sides, and accordingly, it also possible to improve the entire performance of the power converting apparatus.

Further, as shown in FIG. 5, the cooler 700 may be in contact with a plurality of sides of the capacitor 100 to cool the capacitor 100.

The capacitor 100, the power converting module 200, and the control unit 300 can be assembled with the housing 400, and a housing cover 800 can cover the top of the open housing 400.

It will be apparent to those having ordinary skill in the art that various modifications and variations can be made in the present disclosure without departing from the spirit or scope of the disclosure. Thus, it is intended that the present disclosure covers the modifications and variations of this disclosure within the scope of the appended claims and their equivalents.

What is claimed is:

1. A power converting apparatus comprising:
    a capacitor being supplied with a DC from a battery of a vehicle;
    at least one or more power converting modules including a power terminal through which a current is input and output and a signal terminal through which signals are input and output, and disposed perpendicular to the capacitor with the power terminal facing a bottom of the capacitor and the signal terminal facing a top of the capacitor;
    a control unit disposed over the capacitor and controlling the power converting module; and
    a housing assembled with the capacitor, the power converting module, and the control unit.

2. The power converting apparatus of claim 1, further comprising a power supply terminal for supplying a DC to the power converting module and a bus bar transmitting a current output from the power converting module to a driving unit disposed on the bottom of the capacitor.

3. The power converting apparatus of claim 2, wherein the power terminal of the power converting module includes an input terminal configured to receive a DC from the power supply terminal of the capacitor and an output terminal configured to output an AC converted from the DC and connected with the bus bar.

4. The power converting apparatus of claim 2, further composing an epoxy between the bottom of the capacitor and the bus bar.

5. The power converting apparatus of claim 1, wherein the control unit is connected with the signal terminal of the power converting module and controls the power converting module by applying the signal to the power converting module through the signal terminal.

6. The power converting apparatus of claim 1, wherein a horizontal area of the capacitor is equal to or larger than a horizontal area of the control unit.

7. The power converting apparatus of claim 1, further comprising:
    at least one or more coolers disposed on both sides of the power converting module and cooling the power converting module; and
    a cooler cover covering the coolers.

8. The power converting apparatus of claim 7, wherein the cooler includes a plurality of cooling tubes through which cooling water flows, and an inlet and an outlet through which cooling water flows inside and outside, and
    the power converting module is disposed between the plurality of cooling tubes.

9. The power converting apparatus of claim 7, wherein the cooler is in contact with a side of the capacitor to cool the capacitor.

10. The power converting apparatus of claim 1, further comprising a housing cover covering an open top of the housing.

11. The power converting apparatus of claim 1, wherein the control unit includes a control board and a gate board, and the control board and the gate board are connected through a wire.

12. The power converting apparatus of claim 11, wherein the gate board is connected with the signal terminal of the power converting module, and the control board is disposed over and in parallel with the gate board.

* * * * *